United States Patent
Lawson et al.

(10) Patent No.: US 10,552,552 B2
(45) Date of Patent: Feb. 4, 2020

(54) INTERCHANGEABLE FLOW RESTRICTING ORIFICE FOR CLAMSHELL COUPLER

(71) Applicants: Eaton Corporation, Cleveland, OH (US); Frederick James Lawson, Northglenn, CO (US); Jay Mack Caudill, Westminster, CO (US); Jon W. Neal, Denver, CO (US)

(72) Inventors: Frederick James Lawson, Northglenn, CO (US); Jay Mack Caudill, Westminster, CO (US); Jon W. Neal, Denver, CO (US)

(73) Assignee: Eaton Intelligent Power Limited, Dublin (IE)

( * ) Notice: Subject to any disclaimer, the term of this patent is extended or adjusted under 35 U.S.C. 154(b) by 1340 days.

(21) Appl. No.: 14/404,966

(22) PCT Filed: Jun. 5, 2013

(86) PCT No.: PCT/US2013/044297
§ 371 (c)(1),
(2) Date: Jun. 9, 2015

(87) PCT Pub. No.: WO2013/184790
PCT Pub. Date: Dec. 12, 2013

(65) Prior Publication Data
US 2016/0063143 A1    Mar. 3, 2016

Related U.S. Application Data (60) Provisional application No. 61/655,988, filed on Jun. 5, 2012.

(51) Int. Cl.
*F15D 1/02* (2006.01)
*G06F 17/50* (2006.01)

(52) U.S. Cl.
CPC .................. *G06F 17/5004* (2013.01)

(58) Field of Classification Search
CPC .... F15D 1/025; F16L 23/006; F16L 55/02718
(Continued)

(56) References Cited

U.S. PATENT DOCUMENTS 1,515,853 A * 11/1924 Flower .................... F16L 21/06
138/109
1,662,374 A * 3/1928 Woodmansee ............ F16K 3/30
138/44

(Continued)

FOREIGN PATENT DOCUMENTS

CN    102132079 A    7/2011
DE    2952600 A1    7/1981
(Continued)

OTHER PUBLICATIONS

International Search Report for PCT/US2013/044297, dated Aug. 7, 2013, 7 pages.
(Continued)

*Primary Examiner* — James F Hook
(74) *Attorney, Agent, or Firm* — Benesch Friedlander Coplan & Aronoff LLP (57) ABSTRACT

A system for testing fluid flow includes a first tube, a first flange disposed on an end of the first tube, a second tube, and a second flange disposed on an end of the second tube. The second flange is adjacent the first flange. A flow restricting sleeve surrounds the first flange and the second flange. The flow restricting sleeve has an inner surface and an outer surface, with a web extending from the inner surface and defining an orifice. The web extends between the first flange and the second flange. A coupler assembly surrounds the flow restricting sleeve.

6 Claims, 7 Drawing Sheets

(58) Field of Classification Search
USPC .......................................... 138/44, 90, 109
See application file for complete search history.

(56) References Cited

U.S. PATENT DOCUMENTS

| | | | | |
|---|---|---|---|---|
| 2,187,662 | A * | 1/1940 | Pigott | E21B 43/121 138/44 |
| 2,614,423 | A * | 10/1952 | Carbone | G01F 1/42 138/44 |
| 2,842,962 | A * | 7/1958 | Dall | G01F 1/44 138/44 |
| 3,565,117 | A * | 2/1971 | Schmunk | F16L 21/022 138/109 |
| 3,605,251 | A * | 9/1971 | Salerno | B65H 57/06 118/408 |
| 3,958,603 | A * | 5/1976 | Bannon | F16K 15/144 138/43 |
| 4,503,594 | A * | 3/1985 | Gall | G01F 1/42 138/41 |
| 4,625,780 | A * | 12/1986 | Burnham | B65D 71/502 138/44 |
| 5,482,249 | A * | 1/1996 | Schafbuch | F16K 5/0605 138/44 |
| 5,529,244 | A * | 6/1996 | Horvath, Jr. | A01C 23/042 239/318 |
| 6,672,139 | B2 * | 1/2004 | Pampinella | G01M 3/04 138/89 |
| 6,863,088 | B2 | 3/2005 | Toshimi et al. | |
| 7,487,800 | B2 | 2/2009 | Lammers | |
| 7,731,242 | B2 * | 6/2010 | Coscarella | F16L 21/005 137/315.29 |
| 8,365,765 | B2 * | 2/2013 | Bell | G01F 1/42 137/551 |
| 2002/0148521 | A1 * | 10/2002 | Condon | F16L 55/105 138/94.3 |
| 2004/0134550 | A1 * | 7/2004 | Treusch | F02M 37/0017 138/44 |
| 2004/0207197 | A1 * | 10/2004 | Hoang | F16L 39/005 285/123.15 |
| 2007/0006929 | A1 * | 1/2007 | Wolk | F16L 21/005 138/90 |
| 2008/0142089 | A1 | 6/2008 | Fiske | |
| 2009/0322078 | A1 | 12/2009 | Wern et al. | |
| 2017/0307125 | A1 * | 10/2017 | Shinners | F16L 23/06 |

FOREIGN PATENT DOCUMENTS

| | | |
|---|---|---|
| DE | 10354845 A1 | 6/2005 |
| DE | 102004021934 | 12/2005 |
| EP | 0747621 A1 | 12/1996 |
| EP | 1821020 A1 | 8/2007 |
| EP | 2287538 A1 | 2/2011 |
| WO | 2010001214 A1 | 6/2009 |

OTHER PUBLICATIONS

International Preliminary Report on Patentability for PCT/US2013/044297, dated Dec. 9, 2014, 9 pages.
Written Opinion for PCT/US2013/044297, dated Oct. 11, 2013, 8 pages.

* cited by examiner

INTERCHANGEABLE FLOW RESTRICTING ORIFICE FOR CLAMSHELL COUPLER

RELATED APPLICATIONS

This application claims priority to PCT/US2013/044297, filed Jun. 5, 2013 and U.S. Provisional Application No. 61/655,988, filed Jun. 5, 2012, both entitled Interchangeable Flow Restricting Orifice for Claimshell Coupler.

FIELD OF INVENTION

The present disclosure relates to a system for restricting fluid flow along a fluid path. More particularly, the present disclosure relates to a system of interchangeable orifices for restricting fluid flow along a fluid path.

BACKGROUND

Flow restriction is used to tune a flow of fluid conveyed in systems where full flow capacity is not desired to balance conveyance systems. Examples of where such flow restriction is desirable includes fuel lines for aircraft or land or sea vehicles. In designing a fluid flow system, temporary methods of creating flow restriction may be used to tune the system to determine a proper restriction orifice size. Once the proper restriction orifice size is determined, a flange containing a permanent flow restriction orifice is designed and used where the flow restriction is required in the system. In some known instances, the temporary components are not qualified for permanent use. For example, in aircraft fuel lines, the temporary components may not be flight qualified.

Figure 1:
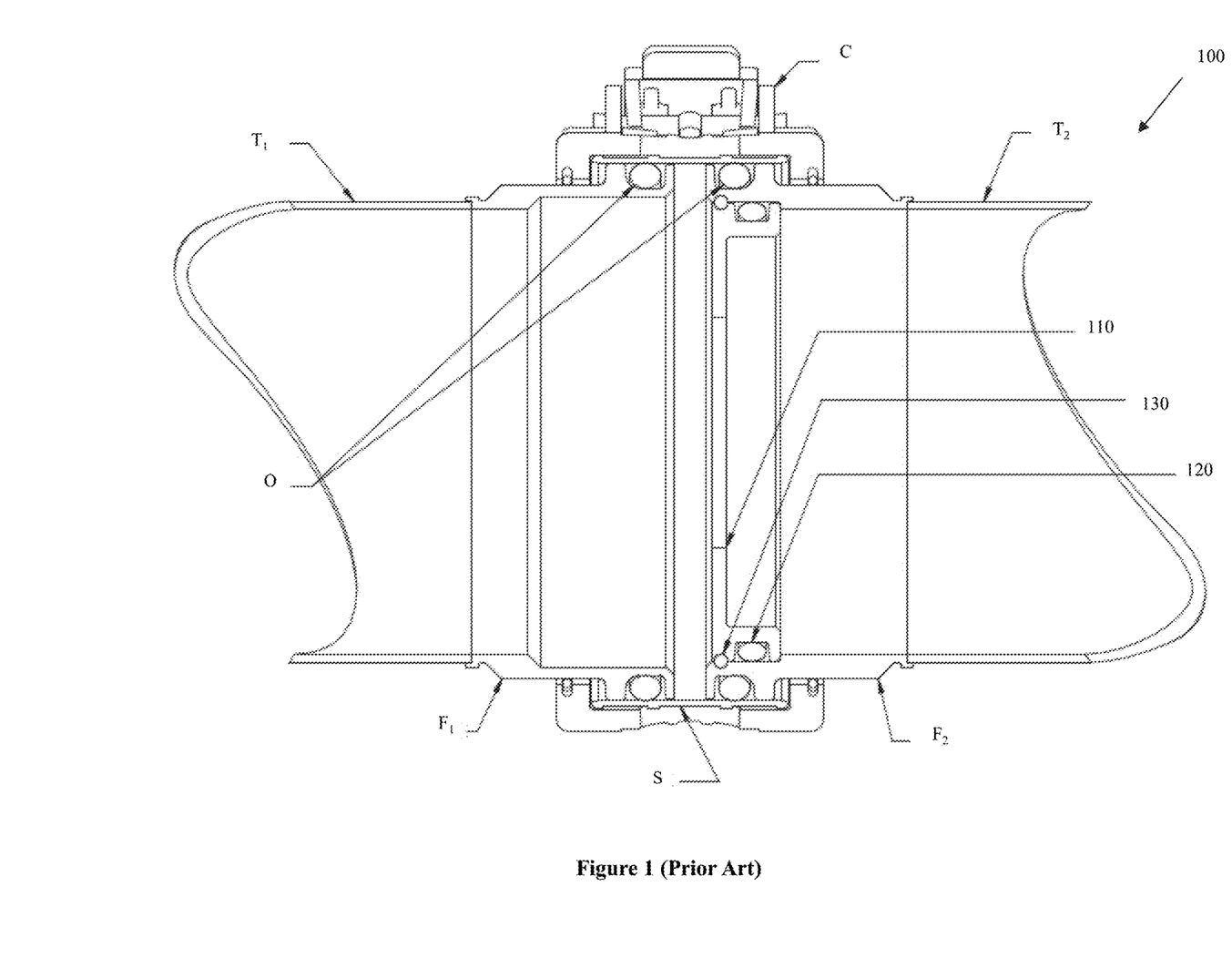
FIG. 1 is a cross-section of a prior art tube assembly 100.
Figure 2:
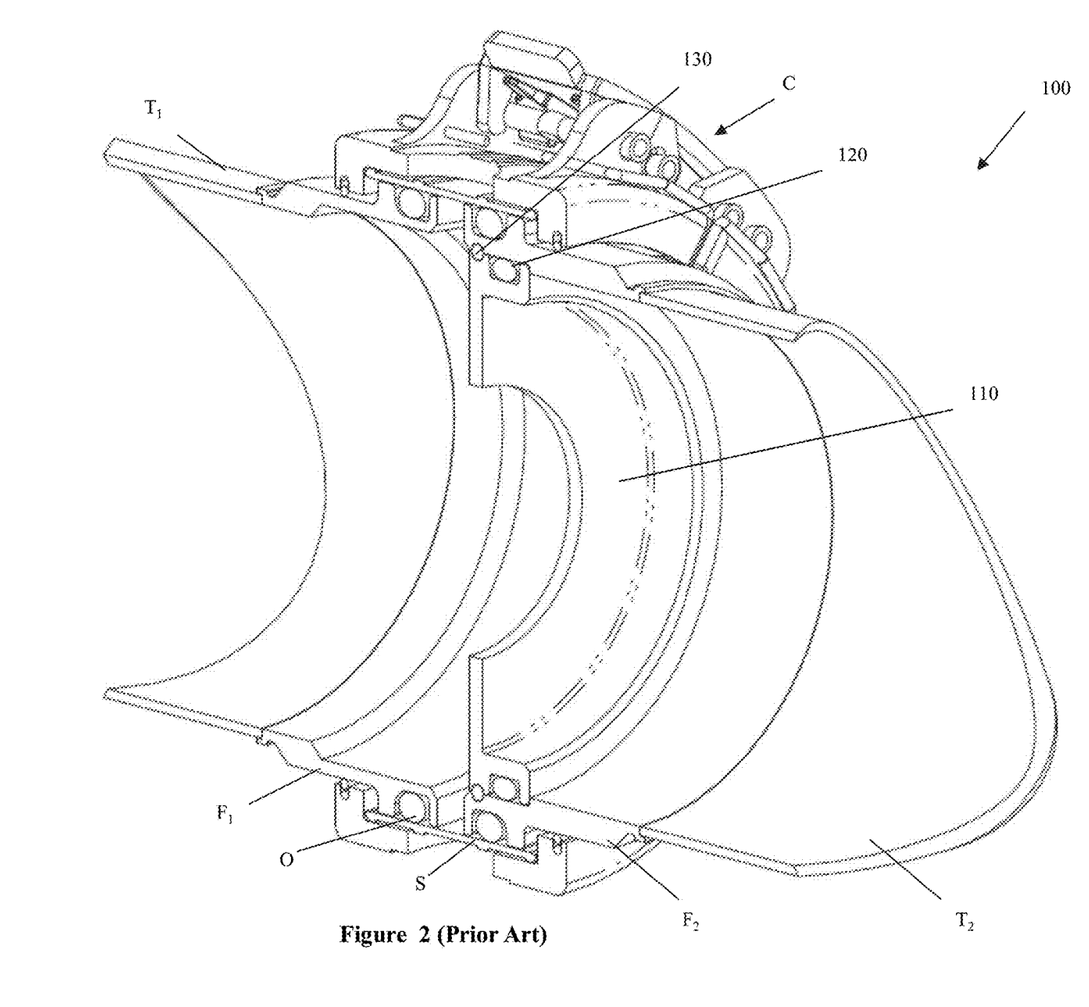
FIG. 2 is a cut-away perspective view of the prior art tube assembly 100.

FIGS. 1 and 2 illustrate a cross-section and a cut-away perspective view, respectively, of a prior art tube assembly 100. The assembly 100 includes a first tube $T_1$ having a first flange $F_1$ adjacent a second tube $T_2$ having a second flange $F_2$. The flanges are surrounded by a sleeve S, and o-rings O or other seals are placed between the first and second flanges $F_1$, $F_2$ and the sleeve S to prevent fluid from leaking, and to lock the joint together. A coupler assembly C captures the sleeve and secures the first and second flanges $F_1$, $F_2$ together. In one embodiment, the coupler assembly C is a clamshell design, having a first and second semi-circular component hingedly connected and configured to be locked in a closed position.

In the illustrated prior art embodiment, the second flange $F_2$ is configured to receive a removable orifice plate 110 having an orifice with a diameter smaller than the inner diameter of the first and second tubes $T_1$, $T_2$, thereby restricting flow of fluid. Although the orifice plate 110 is shown as having a single orifice that is substantially circular, it should be understood that a plurality of orifices of different shapes may be employed.

The second flange $F_2$ has a groove and shoulder on the inner diameter to receive the removable orifice plate 110. The tube assembly 100 may be disassembled to allow an operator to remove the orifice plate 110 and replace it with another removable orifice plate having an orifice of a different size. By removing and replacing orifice plates, an operator may test different sized orifices to arrive at a desirable fluid flow, thereby tuning the system.

In the illustrated embodiment, the removable orifice plate 110 contains accommodations for hardware that secures it to the second flange $F_2$. A seal 120 is disposed between the second flange $F_2$ and the removable orifice plate 110 (illustrated here as an o-ring) to prevent flow around the removable orifice plate 110. Additionally, a retaining wire 130 is employed to hold the removable orifice plate 110 in place.

Figure 3:
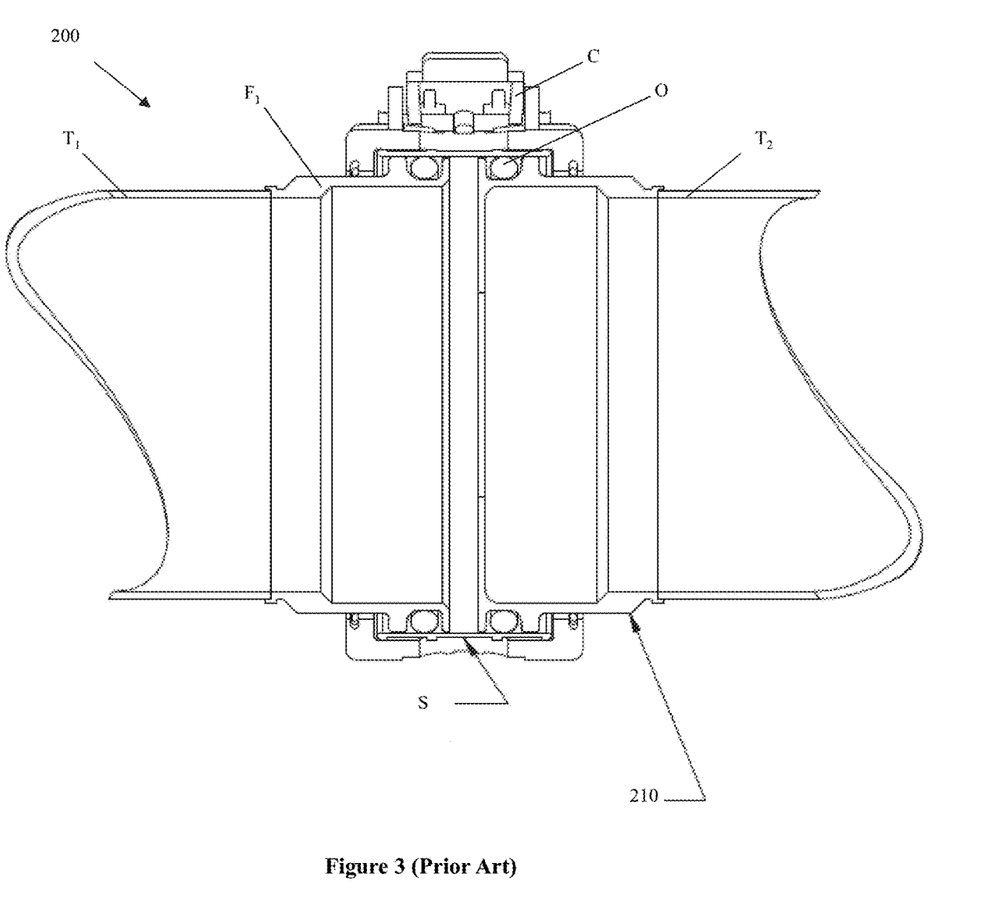
FIG. 3 is a cross-section of an exemplary final tube assembly 200.

After an operator determines a desirable orifice size, the operator may remove the second flange $F_2$ and the removable orifice plate 110 and replace it with a unitary flange and orifice plate. FIG. 3 is a cross-section of an exemplary final tube assembly 200 having a restrictive flange 210. In one embodiment, the restrictive flange 210 is custom-made. When used in an aircraft application, the restrictive flange may be a flight-qualified component.

SUMMARY OF THE INVENTION

A system for testing fluid flow includes a first tube, a first flange disposed on an end of the first tube, a second tube, and a second flange disposed on an end of the second tube. The second flange is adjacent the first flange. A flow restricting sleeve surrounds the first flange and the second flange. The flow restricting sleeve has an inner surface and an outer surface, with a web extending from the inner surface and defining an orifice. The web extends between the first flange and the second flange. A coupler assembly surrounds the flow restricting sleeve.

BRIEF DESCRIPTION OF DRAWINGS

The accompanying drawings, which are incorporated in and constitute a part of the specification, illustrate various example systems and components that illustrate various example embodiments of aspects of the invention. It will be appreciated that the illustrated element boundaries represent one example of the boundaries. One of ordinary skill in the art will appreciate that one element may be designed as multiple elements or that multiple elements may be designed as one element. An element shown as an internal component of another element may be implemented as an external component and vice versa. The drawings may not be to scale and the proportion of certain elements may be exaggerated for the purpose of illustration.

DETAILED DESCRIPTION

Figures 4, 5:
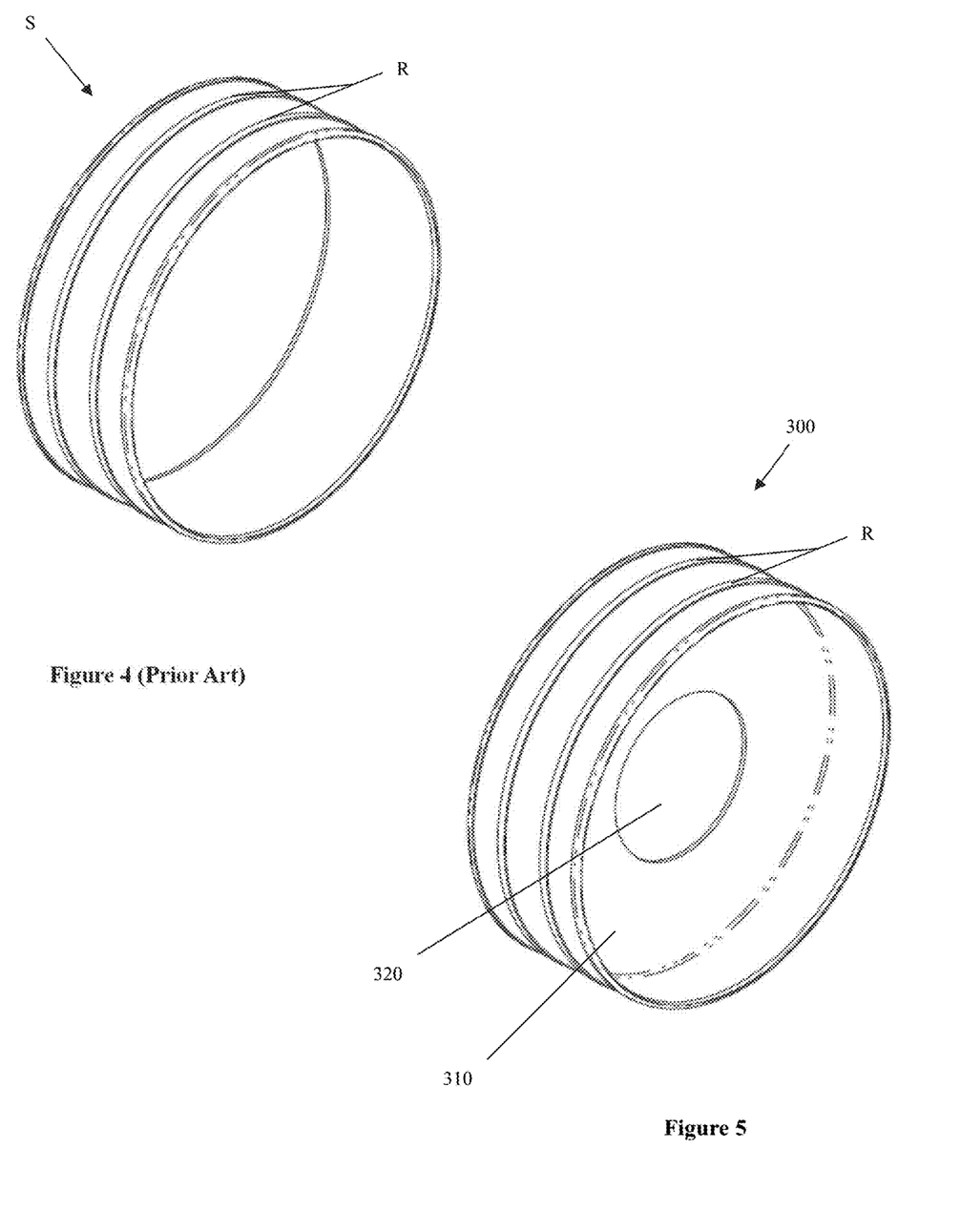
FIG. 4 is a perspective view of a prior art sleeve S for a tube assembly.
FIG. 5 is a perspective view of one embodiment of a flow restricting sleeve 300 for a tube assembly.

FIG. 4 is a perspective view of a prior art sleeve S for a tube assembly. The prior art sleeve S has an inner diameter and an outer diameter, and a plurality of ribs R on an outer surface configured to receive the coupler assembly. In alternative embodiments, ribs may be configured differently or omitted entirely. In another alternative embodiment, the prior art sleeve may have different surface finishes.

FIG. 5 is a perspective view of one embodiment of a flow restricting sleeve 300 for a tube assembly. The flow restricting sleeve 300 has substantially the same outer diameter and inner diameter of the sleeve S of an existing tube assembly. The flow restricting sleeve 300 further includes ribs R that are substantially the same as the ribs R of the sleeve S of an existing tube assembly. Therefore, the flow restricting sleeve 300 may be employed in place of the sleeve S of an existing tube assembly. It should be understood that additional features or finishes may be employed on the inner or outer surface of the flow restricting sleeve 300 to match such features on an existing sleeve S. In other words, the flow restricting sleeve 300 may be configured for any tube assembly. By having the same shape and finish, the flow restricting sleeve 300 can be captured by a coupler assembly C in the same manner as a flight-qualified sleeve, and provide the same seal across the sleeves.

The flow restricting sleeve 300 further includes a web 310 having an orifice 320. In the illustrated embodiment, the web 310 is positioned halfway along the axis of the sleeve 300. In an alternative embodiment (not shown), the web may be off-center.

In the illustrated embodiment, the orifice 320 is substantially circular. In alternative embodiments (not shown), the orifice may be oval, square, triangular, or any geometric shape. In other alternative embodiments (not shown), the web may include two or more orifices.

In one known embodiment, the orifice 320 is machined. A plurality of flow restricting sleeves 300 may be provided, wherein each flow restricting sleeve has an orifice of a different size. In one known embodiment, at least one flow restricting sleeve is provided without an orifice. Such a sleeve would allow an operator to create an orifice of any desired size, such as by drilling or punching the web.

Figure 6:
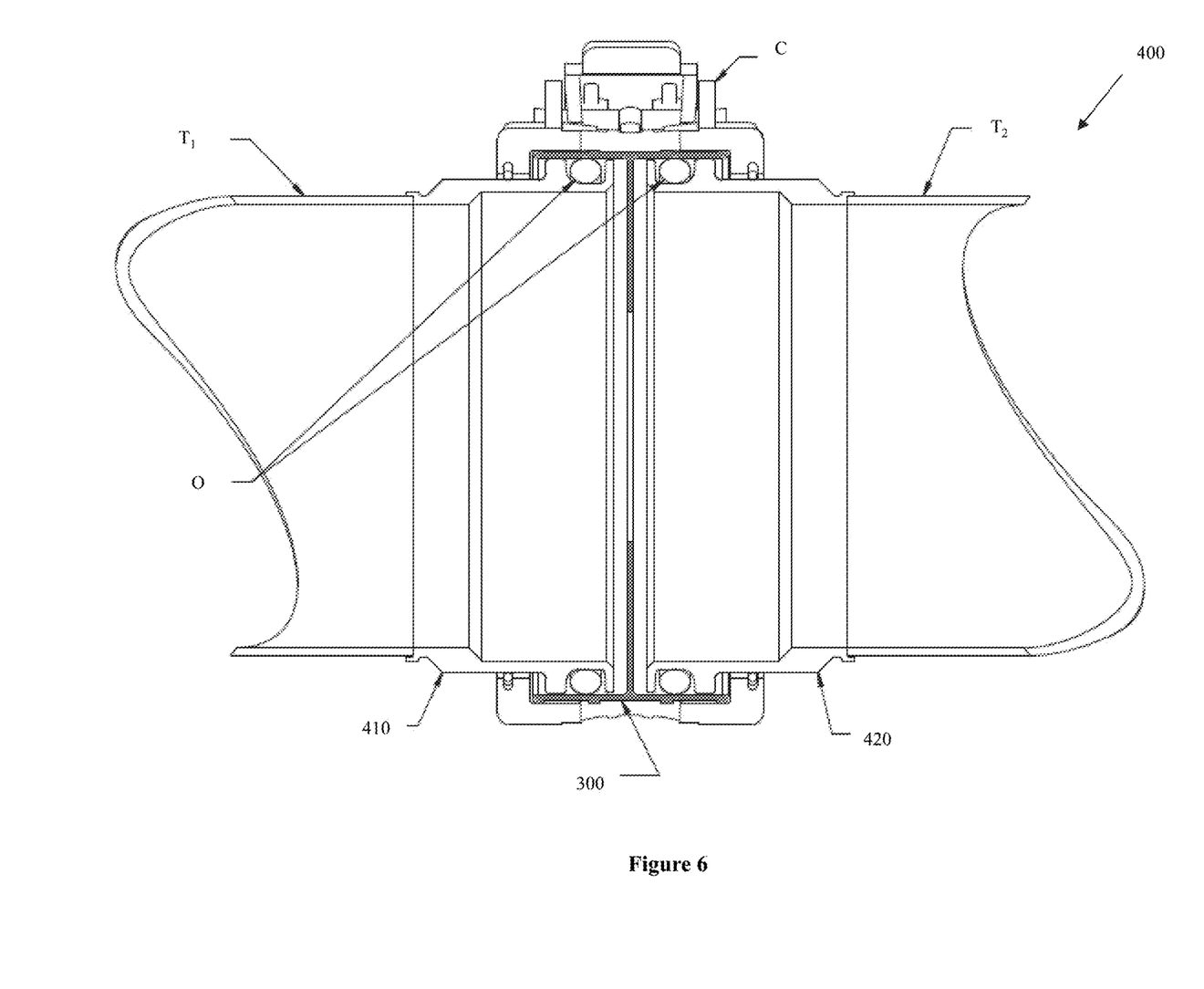
FIG. 6 is a cross-section of one embodiment of a tube assembly 400 having the flow restricting sleeve 300.
Figure 7:
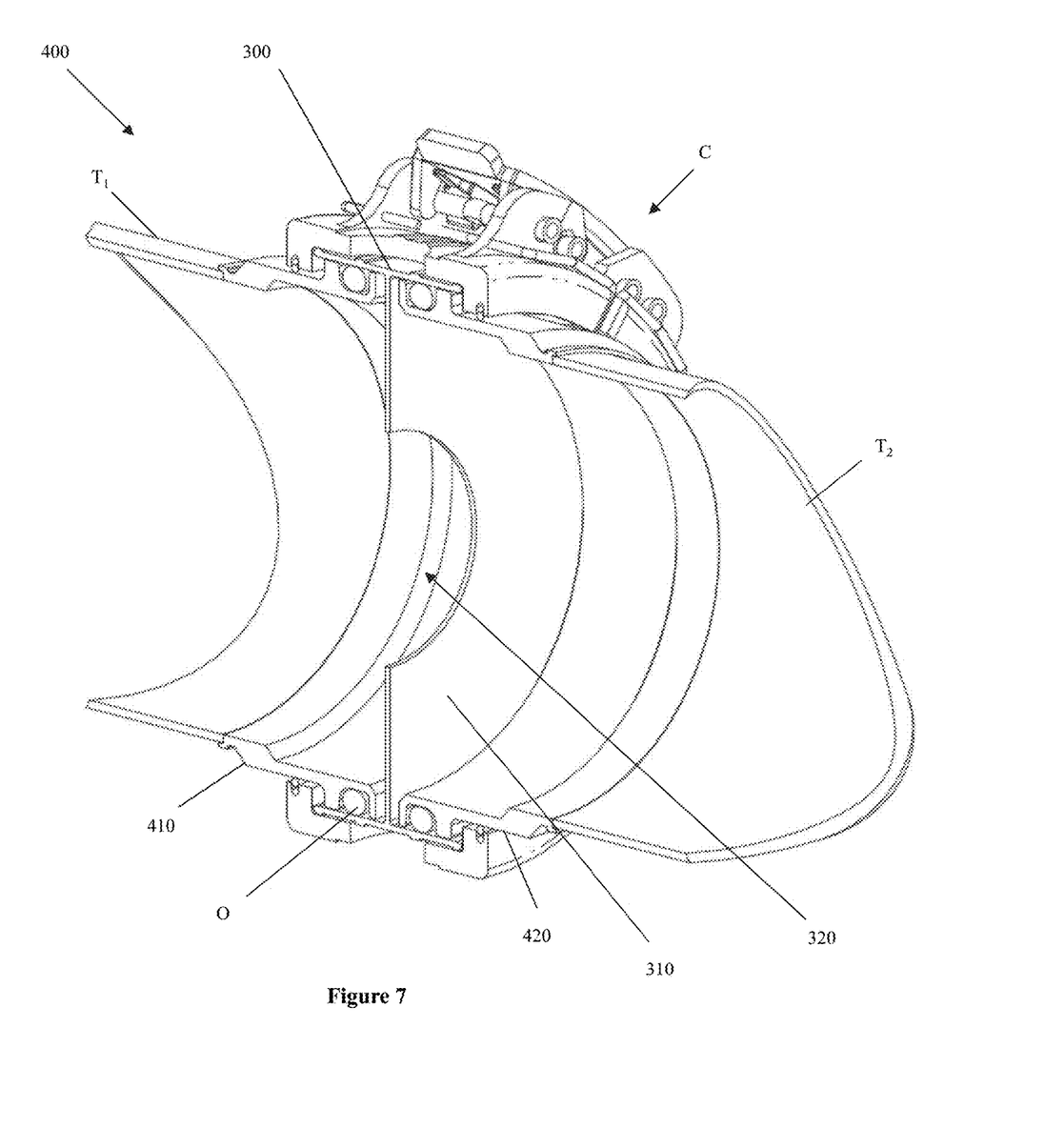
FIG. 7 is a cut-away perspective view of the tube assembly 400.

FIGS. 6 and 7 illustrate a cross-section and a cutaway perspective view, respectively, of one embodiment of a tube assembly 400 including the flow restricting sleeve 300. The assembly 400 includes a first tube $T_1$ having a first flange 410 adjacent a second tube $T_2$ having a second flange 420. The first flange 410 is substantially the same as the second flange 420. The first flange 410 is spaced from the second flange 420 by a gap having a length l.

The flanges 410, 420 are surrounded by the sleeve 300, such that the web 310 extends through the gap between the first flange 410 and the second flange 420. Accordingly, the web 310 has a thickness of less than l. O-rings O or other seals are placed between the first and second flanges 410, 420 and the sleeve S to prevent fluid from leaking, and to lock the joint together. A coupler assembly C captures the sleeve and secures the first and second flanges 410, 420 together. In one embodiment, the coupler assembly C is a clamshell design, having first and second semi-circular components that are hingedly connected and configured to be locked in a closed position.

During testing, an operator may test different flow restricting sleeves, with each flow restricting sleeve having a different orifice configuration. To swap one flow restricting sleeve 300 with another during flow testing, the coupler assembly C is removed, and the flow restricting sleeve 300 containing one specific size of orifice is removed. A flow restricting sleeve containing a different size of orifice is then put in place, and the coupler assembly C is reassembled over the sleeve and flanges 410, 420. This process may be repeated multiple times until the operator achieves a desired fluid flow.

After an operator determines a desirable orifice size, the operator may remove the flow restricting sleeve 300 in the manner described above. The operator may then remove one of the flanges 410, 420 and replace it with a unitary flange and orifice plate having an orifice with the desired dimensions, such as in the exemplary final tube assembly 200 illustrated in FIG. 3. When used in an aircraft application, the unitary flange and orifice plate may be a flight-qualified component.

In one embodiment, the restricting sleeve 300 may be constructed of a material having a color different from that of a flight-qualified component. In one particular embodiment, the flow restricting sleeve 300 is colored red via a dyed aluminum anodizing process during manufacture. The color red is used to indicate components that are not to be used for flight. In alternative embodiments (not shown), the flow restricting sleeve 300 may use other colors, or other visual indicia to indicate that the sleeve is not a flight-qualified component.

Figure 8:
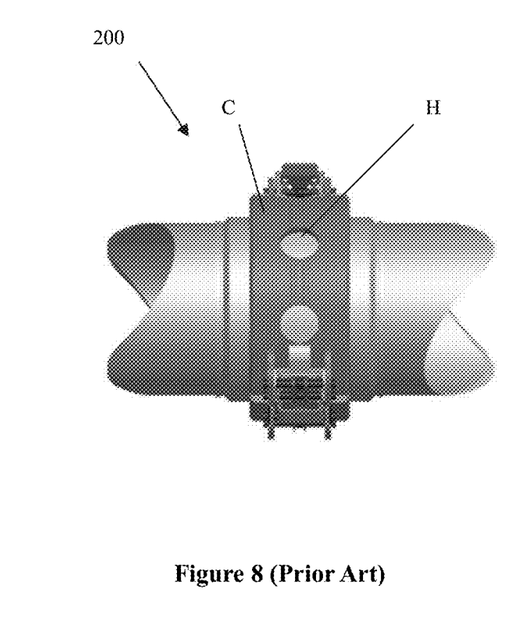
FIG. 8 is a front view of the prior art final tube assembly 200.
Figure 9:
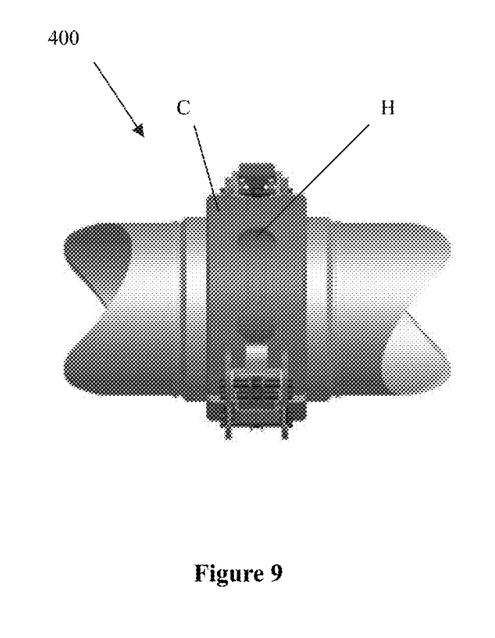
FIG. 9 is a front view of the tube assembly 400.

FIG. 8 is a front view of the prior art final tube assembly 200. For comparison, FIG. 9 is a front view of the tube assembly 400. In both assemblies, the coupler assembly C that captures the sleeve contains inspection holes H in its perimeter that are used to visually verify that a sleeve is installed. In the final tube assembly 200, an inspector can see through the inspection holes H that the sleeve S is a flight-qualified component having a first color. Should a flow restricting sleeve 300 be inadvertently left in a tube assembly, an inspector can see the second color through the inspection holes H, indicating that a non-flight component is present.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A system for testing fluid flow comprising:
    a first tube having an end with an inner diameter providing a flow area at the end of the first tube;
    a first flange disposed on the end of the first tube and reaching circumferentially around and radially outward from the end of the first tube;
    a second tube that is separate from the first tube and has an end with an inner diameter providing a fluid flow area at the end of the second tube;

a second flange disposed on the end of the second tube and reaching circumferentially around and radially outward from the end of the second tube;

a flow restricting sleeve comprising a cylindrical inner surface, a cylindrical outer surface, a web extending radially inward from the inner surface, and a fluid flow orifice formed through the web; and a clamshell coupler assembly locked in a closed position overlying and surrounding the outer surface of the sleeve;

wherein the inner surface of the sleeve overlies and surrounds the first flange and the second flange;

the first flange is spaced axially from the second flange by a gap reaching axially between the ends of the tubes;

the web is located within the gap in a position that is spaced axially from both of the ends of the tubes; and the orifice is spaced radially inward from the inner diameters of the tubes to provide a restricted fluid flow area between the ends of the tubes.

2. The system of claim 1, wherein the flow restricting sleeve has ribs that are located on the outer surface and configured for sealing engagement by the claim shell coupler assembly.

3. The system of claim 1, wherein the web has a uniform thickness radially between the inner surface of the sleeve and the orifice.

4. The system of claim 1, wherein the sleeve has axially opposite ends, the inner surface of the sleeve reaches axially between the web and opposite ends of the sleeve, and the inner surface and has a uniform inner diameter fully between the web and the opposite ends of the sleeve.

5. The system of claim 1, wherein the sleeve is free of fluid flow passages between the inner and outer surfaces.

6. The system of claim 1, wherein the orifice is the only fluid flow orifice in the sleeve.

* * * * *